US011625316B2

United States Patent
Lyberis et al.

(10) Patent No.: US 11,625,316 B2
(45) Date of Patent: Apr. 11, 2023

(54) CHECKSUM GENERATION

(71) Applicant: Arm Limited, Cambridge (GB)

(72) Inventors: Spyros Lyberis, Cambridge (GB); Richard William Earnshaw, Fulbourn (GB)

(73) Assignee: Arm Limited, Cambridge (GB)

( * ) Notice: Subject to any disclaimer, the term of this patent is extended or adjusted under 35 U.S.C. 154(b) by 18 days.

(21) Appl. No.: 16/740,737

(22) Filed: Jan. 13, 2020

(65) Prior Publication Data

US 2020/0226050 A1 Jul. 16, 2020

(30) Foreign Application Priority Data

Jan. 15, 2019 (EP) ..................................... 19386003

(51) Int. Cl.
| | | |
|---|---|---|
| G06F 11/36 | (2006.01) | |
| G06F 9/30 | (2018.01) | |
| G06F 9/54 | (2006.01) | |
| G06F 11/32 | (2006.01) | |
| H03M 13/09 | (2006.01) | |

(52) U.S. Cl.
CPC ........ *G06F 11/366* (2013.01); *G06F 9/30101* (2013.01); *G06F 9/544* (2013.01); *G06F 11/323* (2013.01); *G06F 11/3636* (2013.01); *G06F 11/3672* (2013.01); *H03M 13/096* (2013.01)

(58) Field of Classification Search
CPC .... G06F 11/366; G06F 9/30101; G06F 9/544; G06F 11/323; G06F 11/3636; G06F 11/3672; H03M 13/096
See application file for complete search history.

(56) References Cited

U.S. PATENT DOCUMENTS

| | | | | |
|---|---|---|---|---|
| 4,885,739 A | * | 12/1989 | Read ..................... | H04L 49/253 370/384 |
| 6,543,028 B1 | | 4/2003 | Jamil et al. | |
| 6,658,621 B1 | | 12/2003 | Jamil et al. | |
| 6,901,552 B1 | * | 5/2005 | Fey ..................... | G06F 11/1008 714/800 |
| 2002/0095642 A1 | * | 7/2002 | Karim ................. | H03M 13/096 714/807 |

(Continued)

OTHER PUBLICATIONS

Wikipedia, "Parity Bit," 2018 [retrieved on Mar. 25, 2021], pp. 1-7, downloaded from The Wayback Machine Internet Archive at <url>:https://web.archive.org/web/20181228185936/https://en.wikipedia.org/wiki/Parity_bit. (Year: 2018).*

(Continued)

*Primary Examiner* — S. Sough
*Assistant Examiner* — Stephen D Berman
(74) *Attorney, Agent, or Firm* — Nixon & Vanderhye P.C.

(57) ABSTRACT

An apparatus has processing circuitry to perform data processing in response to instructions; at least one control storage element to store internal state for controlling operation of the processing circuitry; and checksum generating circuitry to generate a checksum based on at least one item of internal state stored in the at least one control storage element. The checksum is stored in a diagnostic storage location from which information is accessible to a diagnostic control agent (e.g. software executing on the processing circuitry and/or an external device). This makes design of software test libraries for detecting hardware faults much more efficient.

14 Claims, 3 Drawing Sheets

(56) References Cited

U.S. PATENT DOCUMENTS

Figure 1:
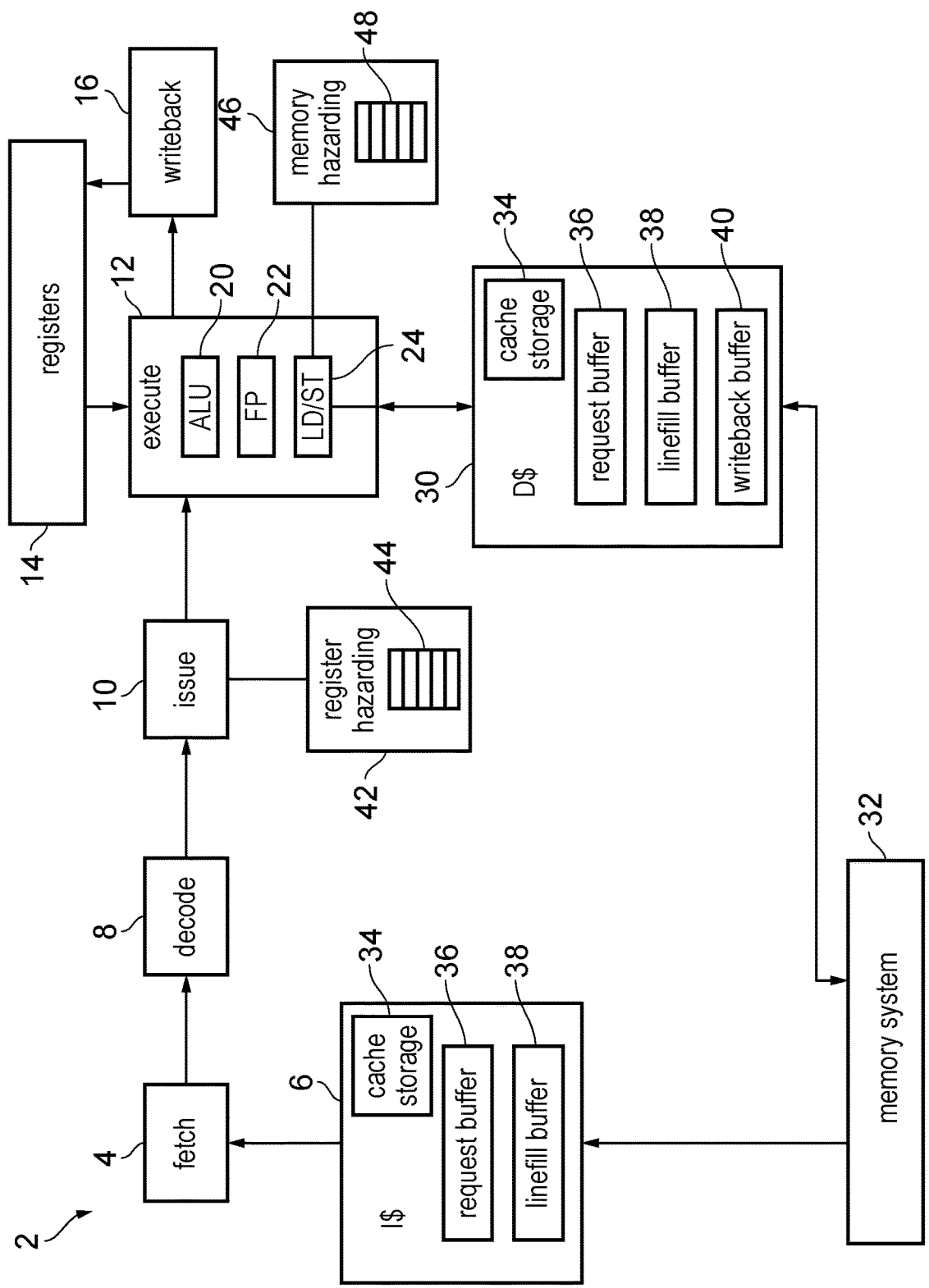

| | | |
|---|---|---|
| 2002/0199151 A1 | 12/2002 | Zuraski, Jr. |
| 2009/0217077 A1 | 8/2009 | Busaba et al. |
| 2012/0304041 A1* | 11/2012 | Gammel ............. H03M 13/091 |
| | | 714/E11.032 |
| 2014/0331019 A1* | 11/2014 | Parker ................. G06F 12/1458 |
| | | 711/163 |
| 2017/0075760 A1* | 3/2017 | Ozer ................... G06F 11/1076 |
| 2017/0083326 A1* | 3/2017 | Burger ................. G06F 9/3848 |
| 2017/0286202 A1 | 10/2017 | Barrick et al. |
| 2019/0079795 A1* | 3/2019 | Feehrer ............... G06F 13/4282 |
| 2019/0250969 A1* | 8/2019 | Tan ..................... G06F 11/0736 |
| 2020/0183782 A1* | 6/2020 | Nakai ................. G06F 11/1048 |

OTHER PUBLICATIONS

Wang et al., "TaintScope: A Checksum-Aware Directed Fuzzing Tool for Automatic Software Vulnerability Detection," 2010 [retrieved on Jan. 28, 2022], 2010 IEEE Symposium on Security and Privacy, pp. 497-512, downloaded from <url>:https://ieeexplore.ieee.org. (Year: 2010).*

Extended Search Report for EP19386003.8, dated Jun. 28, 2019, 8 pages.

* cited by examiner

CHECKSUM GENERATION

This application claims priority to EP Patent Application No. 19386003.8 filed 15 Jan. 2019, the entire contents of which is hereby incorporated by reference.

The present technique relates to the field of data processing.

A data processing apparatus may have processing circuitry to perform data processing in response to instructions. The apparatus may also include at least one control storage element which stores internal state for controlling operation of the processing circuitry. Some such control storage elements may store state which does not directly influence the processing results generated in response to particular instructions, but may affect the performance achieved when processing the instructions.

At least some examples provide an apparatus comprising: processing circuitry to perform data processing in response to instructions; at least one control storage element to store internal state for controlling operation of the processing circuitry; and checksum generating circuitry to receive at least one item of internal state stored in said at least one control storage element following processing of a sequence of instructions by the processing circuitry, and to generate a checksum based on said at least one item of internal state; in which: the checksum generating circuitry is configured to store said checksum in a diagnostic storage location from which information is accessible to a diagnostic control agent, said diagnostic control agent comprising at least one of software executing on the processing circuitry and an external device.

At least some examples provide a method for diagnostic testing of an apparatus comprising processing circuitry to perform data processing in response to instructions, and at least one control storage element to store internal state for controlling operation of the processing circuitry; the method comprising: controlling checksum generating circuitry of the apparatus to generate a checksum based on at least one item of internal state stored in said at least one control storage element following processing of a sequence of instructions by the processing circuitry; reading the checksum generated by the checksum generating circuitry from a diagnostic storage location accessible to a diagnostic control agent, where the diagnostic control agent comprises at least one of software executing on the processing circuitry and an external device; and comparing the checksum read from the diagnostic storage location with a target value to determine whether an event of interest occurred during the processing of the sequence of instructions by the processing circuitry.

A computer program may be provided to control apparatus to perform the method described above. The computer program may be stored on a storage medium. The storage medium may be a non-transitory storage medium.

Figure 2:
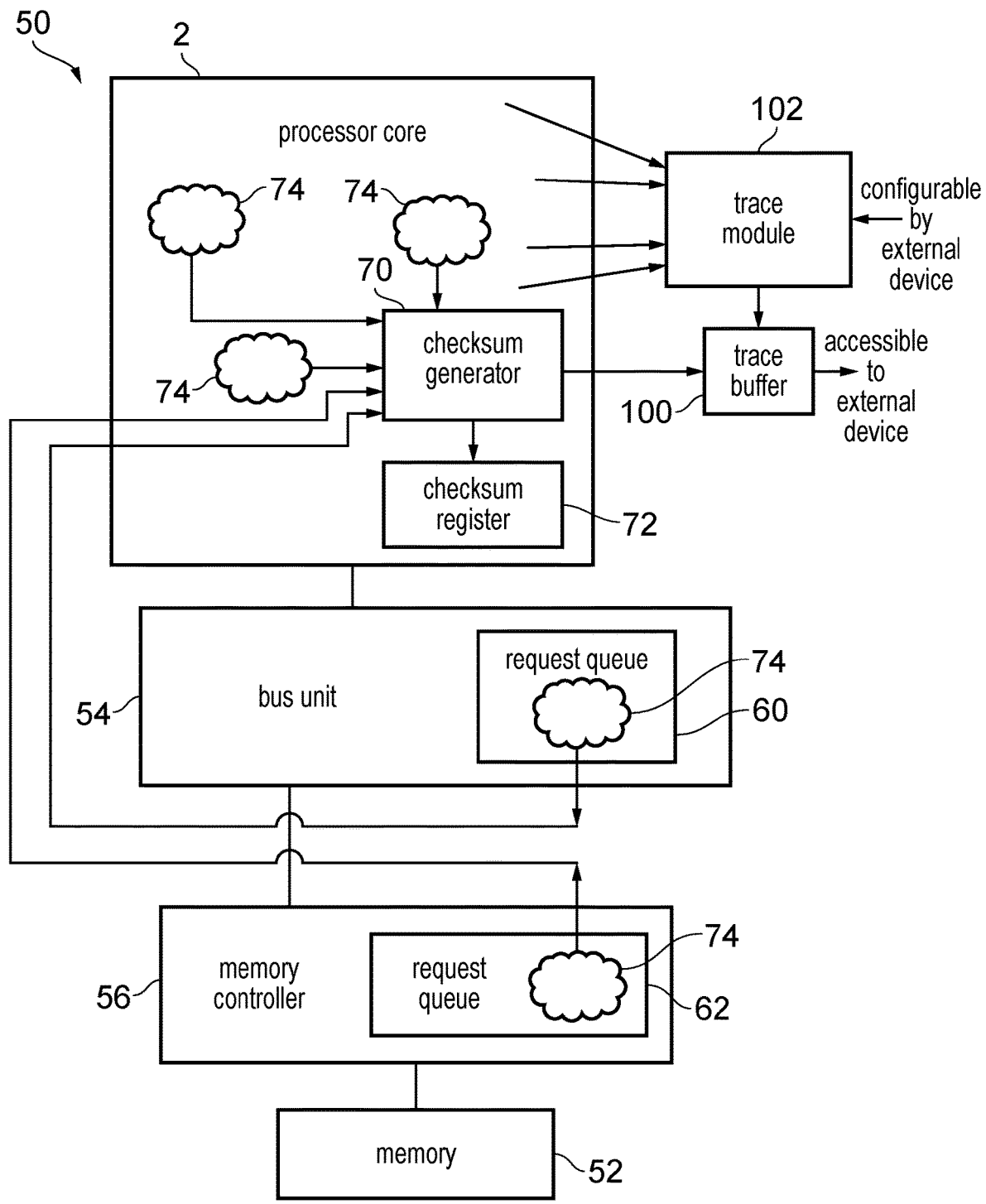
Figure 3:
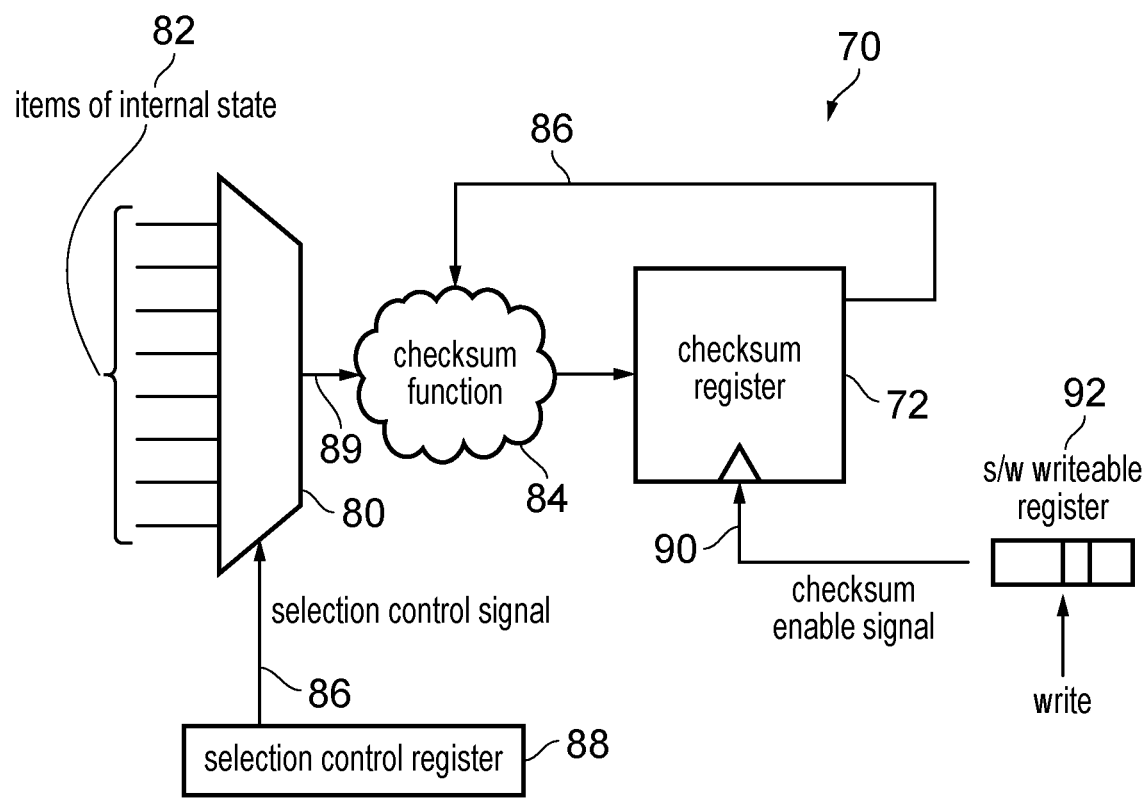

Further aspects, features and advantages of the present technique will be apparent from the following description of examples, which is to be read in conjunction with the accompanying drawings, in which:

FIG. 1 schematically illustrates an example of a data processing apparatus;

FIG. 2 shows an example of the apparatus having checksum generating circuitry for generating a checksum based on at least one item of internal state; and FIG. 3 shows an example of a checksum generating circuitry in more detail.

For a number of reasons it can be useful to provide diagnostic techniques whereby information on the functioning of a data processing apparatus is exposed to a diagnostic control agent, such as software executing on the processing circuitry or an external device. For example, during software development of software intended to run on the particular processor, an external diagnostic device could control a trace module embedded in the processor to probe aspects of how instructions are being executed, to try and identify bugs in the software based on the trace data output by the trace module. Also, once a device is operational in the field, diagnostic measures may be provided for detecting hardware faults which may randomly arise due to ageing effects such as electromigration. For example, for some safety-critical applications it may be desirable to run software test libraries (STLs), also known as software built in self test (SBIST) algorithms, which run on the processor at boot time or periodically at intervals during regular operation, to scrub for hardware faults such as gates stuck at 0 or 1 for example.

It may be relatively straightforward for a diagnostic control agent to detect faults associated with some parts of the processing logic provided with a given processor, where these faults are visible from the processing results generated by instructions executed by the processing circuitry. However, there may be other elements which store internal state for controlling operation of the processing circuitry, which are much harder to cover with diagnostic algorithms. For example, when developing software code for software test libraries, it can be relatively easy and cost effective to write tests which cover a certain fraction of the logic (e.g. around 60%), but then it becomes increasingly difficult and expensive to increase the coverage to reach 70-80% of the logic. The vast majority of software development time in developing software test libraries can therefore be spent on attempting to probe this hard to reach state. Also, even if such hard-to-reach state can be covered, the number of instructions required in an algorithm designed to probe errors in that state may be extremely large (e.g. needing many iterations of code loops, and time-based measurements to probe the errors that could be caused by hardware faults). The longer test algorithm required increases the latency associated with executing the software test library, e.g. leading to longer periods where the device is out of use for testing, and also increases the memory overhead of storing the test code.

In the techniques discussed below, a processing apparatus is provided with checksum generating circuitry to receive at least one item of internal state stored in at least one control storage element following processing of a sequence of instructions by the processing circuitry. The checksum generating circuitry generates a checksum based on the received at least one item of internal state. The checksum is stored to a diagnostic storage location from which information is accessible by a diagnostic control agent. The diagnostic control agent may be at least one of: software executing on the processing circuitry, and an external device.

Hence, elements of internal state which may be hard to reach by conventional diagnostic methods can be probed by the checksum generating circuitry in hardware, and the checksum can be exposed to the external device or the software acting as the diagnostic control agent. By generating a checksum based on the internal state, rather than exposing the internal state directly, this can reduce the overhead associated with performing error checking on a potentially large amount of internal state. The checksum may effectively act as a digest of one or more items of internal state passed to a checksum generating circuitry so as to reduce the number of bits that would need to be checked by the diagnostic control agent.

Hence, the checksum generating circuitry enables the amount of the processing logic that can be covered by diagnostic schemes to be increased without requiring a significant amount of additional circuit overhead, which can be particularly useful for enhancing the coverage of software test libraries for the reasons discussed above.

In some implementations, the checksum generating circuitry could be specific to a particular item of internal state, so that there is no ability to apply the checksum generating circuitry to more than one type of internal state.

In other examples, the checksum generating circuitry may be able to receive multiple items of internal state from a number of different control storage elements. This can increase the coverage of the diagnostic scheme.

When multiple items of internal state are provided to the checksum generating circuitry, one approach could simply be to generate the checksum based on each of those items, without any ability to select which particular subset of those items is used in calculating the checksum.

However, it can be useful to provide the checksum generating circuitry with a selector to select the at least one item of the internal state (from which the checksum is to be generated) from among two or more items of internal state received from a number of control storage elements. The selector may select the at least one item of internal state based on a selection control signal which is set by the diagnostic control agent or generated automatically based on configuration information set by the diagnostic control agent. This allows the diagnostic control agent to influence which particular items of internal state are used to generate the checksum so that the diagnostic control agent can focus on errors in a particular region of the processing logic for a particular test or investigation. This allows the location of errors to be pinpointed more precisely.

In one example, the selection control signal may be derived from a selection control value which is stored in a software-writeable register. This can be useful for supporting software test libraries as discussed above, which may write to the software-writeable register to select which item of internal state is to be used to generate the checksum, then run some tests and capture the correspondingly generated checksum in the diagnostic storage location, and then read the value from the diagnostic storage location and compare it with an expected value to determine whether there has been a fault.

In some examples, the checksum generating circuitry could control whether the checksum is updated in response to the at least one item of internal state, based on a checksum update enable signal set by the diagnostic control agent or generated based on configuration information set by the diagnostic control agent. This can allow the diagnostic control agent to set whether the checksum generating circuitry is active or not, or to specify the timing at which the checksum is updated. Again, the checksum update enable signal could be asserted by circuitry which controls the update enable signal based on a write to a software-writeable register. When the checksum update enable signal is deasserted, the previous value of the checksum may be retained in the diagnostic storage location, without being updated.

In one example, the diagnostic storage location may comprise a software-accessible which is accessible to software executed by the processing circuitry. This makes the checksum readable by software executing on the processing circuitry, such as software test libraries as discussed above. It may be seen as unusual to expose checksums generated based on internal state to software in this way. While in some systems checksum generators may already be provided for guarding against transient faults (such as single event upsets caused by cosmic rays or particle strikes), this would normally be used to detect occurrence of such faults and then silently correct the fault in a manner that is transparent to software so as to allow processing to continue as if the fault never happened. This is quite different to the checksum generator discussed above, where the checksum derived from a number of pieces of internal state is made accessible to software executing on the processing circuitry, which can help to support more efficient software test libraries which do not require as large code size to be able to probe errors in some hard to reach parts of the processing circuit logic.

In other examples, the diagnostic storage location could comprise a trace buffer which is used by trace circuitry to store trace data which indicates properties of the data processing performed by the processing circuitry or events occurring during data processing performed by the processing circuitry.

For assisting with software development, it can be useful for a processor to include an on-chip trace module which monitors the data processing by the processing circuitry and outputs trace packets indicating certain events that occurred during the processing. For example, the trace packets may provide trace information that enables a trace analyser to reconstruct the precise sequence of instructions that was executed by the processing circuitry when executing software for a given application. For example, trace packets could indicate the outcomes of conditional branches, the occurrence of exceptions or interrupts, or information on data addresses that have been accessed.

By outputting a checksum derived from a number of pieces of internal control state into the trace buffer, this can provide a trace analyser with some visibility of events which might not directly be visible from the instruction tracing itself, such as loss of performance caused by a particular control buffer becoming full. Also, the checksum could be derived from a certain combination of items of internal state (either internal state from different storage elements, or a series of values of internal state from the same storage element captured at different times) and this could allow more complicated combinations of events to be identified from the checksum value, which would be different to analyse from other trace data. This could be useful for setting trace trigger events which trigger some diagnostic action (e.g. switch to debug mode, or the start or stop of output of trace data from the trace buffer to an external device) when a certain pattern of trace data is identified. By providing the checksum to the trace buffer, trace trigger events can be made conditional on the checksum meeting certain conditions (such as matching a particular value of interest), which can provide more flexibility for supporting additional trigger conditions. This can increase the ability for the trace analyser to investigate what is happening when a certain software program is being executed.

The output of the checksum to the trace buffer could be performed in addition to output of the checksum to a software-accessible register as discussed above. Alternatively, in some embodiments only one of the software accessible register and the trace buffer may be used as the diagnostic storage location to which the checksum is output by the checksum generating circuitry.

In some implementations, the checksum generating circuitry may generate a new value for the checksum using a checksum function which depends on a previous value of the checksum and the at least one item of internal state. Hence, the checksum function may be a cyclic function where the latest value of the checksum is returned as an input to the next checksum calculation. For example the checksum could use a cyclic redundancy check (CRC) function. This can be useful for generating a checksum which depends on a series of values of internal state recorded over period of time, as this allows checking of whether an error was present in any of those values by checking a single value of the final checksum. A cyclic checksum generating function can also be useful in cases where the checksum is to be derived from multiple pieces of different internal state stored in different storage elements. In this case the selector described above could be used to cycle through selecting different items of internal state from the respective storage elements and a single checksum value may be calculated iteratively, with each update to the checksum folding in the next item of internal state, until the final checksum depends on all of the selected items of internal state, and errors in any of those items of state can be detected from whether the final checksum matches an expected result. Again, this simplifies the design of the software test library or the trace infrastructure as fewer bits of the state need to be checked to probe errors or detect trace trigger events.

In principle, the checksum generating circuitry could be applied to any item of processor state stored in any storage element of the processor. However, in practice many storage elements in the processor may already be accessible to the diagnostic control agent, such as the registers which can be written to or read by software executing on the processing circuitry and which could be probed by an external diagnostic device using a debug mode. Hence, in practice it can be useful for the checksum generating circuitry to be applied to at least one control storage element for which the internal state stored in that element is inaccessible to the diagnostic control agent through mechanisms other than via the checksum generating circuitry.

In particular, the at least one item of processor state may be micro-architectural state of the processor. Unlike architectural state, which is required to be provided in a processor in order to be compatible with a given instruction set architecture, and which is typically readable/writable directly by software executing in at least one operating state of the processing circuitry, micro-architectural state is state provided in a particular hardware implementation of the processor, which is not directly required by the instruction set architecture supported by the processor. The micro-architectural state may influence the execution of instructions, but the instructions cannot directly read or write that micro-architectural state. Such micro-architectural state may be relatively hard to probe using conventional diagnostic methods, as an error in such state storage elements may not necessarily result in incorrect processing results but could also cause loss of performance, for which the reason may be harder to diagnose.

Examples of such hard-to-reach control storage elements may be any of the following:
register hazarding circuitry to store register tracking information for detecting register hazards between respective instructions processed by the processing circuitry;
memory hazarding circuitry to store address tracking information for detecting address hazards between respective memory access requests to be serviced by a memory system;
a cache buffer (e.g. a linefill buffer or writeback buffer) to store information on requests awaiting servicing by the cache, data awaiting allocation into the cache, or data awaiting writeback to memory;
bus control circuitry to store information on bus requests made on a bus; and
a memory controller to store information on memory access requests made to a memory.

By exposing state from one of the types of control storage element discussed above to the checksum generating circuitry and then making the checksum accessible to software, this greatly simplifies software test library (STL) design and makes STL algorithms for probing errors in these elements much more efficient.

FIG. 1 shows an example of components of a processor core 2. The processor core may include a processing pipeline having a number of pipeline stages, including a fetch stage 4 for fetching instructions from an instruction cache 6, a decode stage 8 for decoding the fetched instructions to identify what processing operation need to be performed and for generating control signals for controlling downstream stages of the pipeline to perform the appropriate processing operations, an issue stage 10 for issuing instructions for execution once their required operands are available, an execute stage 12 for executing instructions to perform data processing operations on operands read from registers 14 to generate processing results, and a writeback stage 16 which writes the processing results back to the registers 14. It will be appreciated that this is just one example of a potential pipeline architecture and other examples may have different configurations of pipeline stages. For example, in an out-of-order processor there may be a register renaming stage for mapping architectural registers specified by instructions to physical registers 14 provided in hardware. Also, the execute stage 12 may be split into a number of execute pipeline stages.

The execute stage 12 includes a number of execution units including for example an arithmetic/logic unit (ALU) 20 for performing arithmetic or logical operations, a floating point unit 22 for performing operations involving data values represented as floating point numbers, and a load/store unit 24 for handling memory access operations to load data from the memory system to the registers 14 or store data from the registers 14 to the memory system. The memory system may include the instruction cache 6, a data cache 30 (and potentially further levels of cache) as well as remaining parts of the memory system 32 which may be disposed outside of the processor core, such as DRAM units or other forms of memory. It will be appreciated that the particular set of execution units 20, 22, 24 and the particular memory hierarchy 6, 30, 32, shown in FIG. 1 is just one example.

As shown in FIG. 1, the processor core may include a number of control storage elements which store items of internal state used to control the processing instructions by the processor pipeline. These may be items of micro-architectural state which are invisible to software instructions executed by the pipeline (that is, no instruction in the instruction set architecture supported by the processor has an architectural definition requesting that a value is written to this micro-architectural state or read from this micro-architectural state). For example, the instruction cache 6 and data cache 30 may, in addition to the cache storage 34 which stores the actual data or instructions, also include one or more buffers for buffering requests made to the cache or by the cache. For example the instruction cache 6 may include a request buffer 36 for buffering fetch requests from the fetch stage 4 to fetch instructions from the cache. The data cache 30 may have a similar request buffer 36 for buffering read or write requests made to the cache by the load/store unit 24. Also the caches 6, 30 could have a linefill buffer 38 for buffering data or instructions which have been read from the memory system 32 but are awaiting allocation into the cache storage 34. The data cache 30 could also include a writeback buffer 40 which buffers requests for data to be written back to memory 32.

Another example of a control storage element may be register hazarding logic 42 which may be used by the issue stage 10 to identify read after write (RAW), write after read (WAR) or write after write (WAW) hazards between instructions pending in the pipeline. For example the register hazarding logic may have a buffer 44 for tracking the register numbers of the registers to be read or written by the instructions awaiting issue for execution. The register hazarding logic 42 may prevent a subsequent instruction that reads or writes to the same register as an earlier instruction being issued for execution until the earlier instruction has completed.

Also the load/store unit 24 may be associated with memory hazarding logic 46 for detecting data hazards between respective memory access instructions specifying the same address. For example the memory hazarding logic 46 may include a store buffer 48 which may track the addresses of store instructions for which store requests have not yet been issued to memory system, so that if a subsequent load instruction to the same address is encountered then the load can be serviced using the data value which would have been stored in response to the store instruction, and if a subsequent store instruction to the same address of an earlier store is encountered then the data values to be stored to memory for those two store instructions can be combined into a single request to memory. Also, the memory hazarding logic may be used to ensure that memory access requests are handled in an appropriate order.

As shown in FIG. 2, the processor core 2 may be included within a larger data processing system, where it is used in conjunction with external memory 52. The core 2 may access memory via a bus unit 54 and a memory controller 56. While FIG. 2 shows only a single processor core 2 in the system 50, in other examples this could be a multi-processor system where two or more processor cores communicate via the bus unit 54 and access shared memory 52. Also other master devices could be coupled to the bus unit such as display controllers, graphics processing units, etc., and also the bus unit 54 could control access to other slave devices such as peripherals. As shown in FIG. 2, within the bus unit 54 or the memory controller 56, there may be further items of internal control state such as a request queues 60, 62 for buffering requests made on the bus or to memory respectively.

Hence, there may be a number of pieces of internal state throughout the system which may store values which influence the processing of the instructions on the processor core. Such items of internal state may be vulnerable to hardware faults, for example where ageing affects such as electromigration cause a particular gate to become stuck at a particular value such as binary 0 or binary 1, leading to incorrect values being stored in a given part of the internal state. For applications which are safety critical, it can be useful to provide software test libraries (STLs) for probing such hardware faults. However, it can be difficult to develop STLs that can probe the types of internal control state described above. Typically it can be relatively straight forward and cost effective to write tests which cover around 60% of the logic but it is extremely difficult and expensive to reach as much as 70-80% coverage.

As shown in FIG. 2, the processor core 2 may be provided with a checksum generator 70 which acts as a small internal checksumming engine. Various units 74 (e.g. any of the elements 36, 38, 40, 42, 46, 60, 62 described above) of the processor core 2 and surrounding processing system may expose multiple bits of their internal state to the checksumming unit 70. A diagnostic control agent (e.g. STL software executing on the processor core 2) can select specific pieces of internal state to use to generate a checksum value using the checksum generator 70. The checksum value is stored in a software accessible checksum register 72, from which it can be read by the STL software and compared with an expected value to identify faults in this hard to reach state.

Hence, the hard to reach internal state, such as control bits in linefill buffers, identifier bits in bus control units, etc., becomes visible to the testing software. This both improves coverage and reduces the STL code size and development time as much fewer instructions would be needed to test the hard to reach areas, than if alternative techniques using multiple loops and expensive time-based checks are used in the STL to probe these items of internal state.

FIG. 3 shows the checksum generating logic 70 in more detail. A selector 80 receives a number of items of internal state 82 from the various control storage elements 74 as discussed above. It will be appreciated that in a given implementation it is not necessary for all of the control storage elements 36, 38, 42, 46, 40, 60, 62 described above to provide their values to the checksum generator 70 (the control storage elements 74 may be a subset of these elements, or may include other elements). The selector 80 selects one of these items of state to be supplied to a checksum calculator 84, with the selection being made based on a selection control signal 86 which is set based on a selection control register 88 which is writable by software. Hence, the STL code can write a control value to the selection control register 88 to specify which item of internal state should be used to calculate the checksum.

The checksum calculator 84 calculates a new value of the checksum using a cyclic function which depends on the previous value of the checksum 86 and on the selected item of internal state 88 selected by the checksum 80. Any known checksum function could be used, such as a CRC or similar function. The new value of the checksum is written to the checksum register 72. Whether or not the checksum register is updated 72 may depend on the checksum enable signal 90, which again is dependent on a software writable register 92 which is accessible to the software executed on the processor 2. For example by writing to a particular bit of the software writable register 92, this could trigger the checksum enable signal to be asserted or deasserted depending on the value written to that bit. The checksum register 72 could be implemented as an asynchronously updated register, where each time the checksum enable signal 90 is asserted the checksum value is updated based on the result of applying the checksum function 84 to the previous value of the checksum and the currently selected item of internal state 89 provided by the selector. Alternatively, the checksum register 72 could be a synchronous register which, when the checksum enable signal 90 is asserted, each rising edge (or alternatively each falling edge) of a clock signal triggers the next update of the checksum register, while when the enable signal 90 is deasserted, the register retains its current state regardless of any clock pulses on the clock signal.

Hence, the provision of a checksum generator in hardware to expose a checksum derived from one or more pieces of internal states to the software can greatly simplify development of software test libraries.

In one particular application, the checksum generator could be used to increase coverage on the register hazarding logic 42 which analyses register hazards in the processor pipeline, and responds to detected hazards by stalling the pipeline or by forwarding data from producer to consumer instructions. Such hazarding logic may experience two kinds' of faults. Firstly, there may be faults where the hazarding logic erroneously decides that there is no hazard, but a hazard does actually exist, e.g. due to a stuck at 0 or stuck at 1 error occurring in a storage element in the register tracking buffer 44. A second type of fault could be where the hazarding logic 42 erroneously decides there is a hazard, but a hazard does not actually exist. Faults of the first type are relatively easy to detect with a STL because they lead to data corruption. This could be detected using software-based algorithms for calculating checksums which are relatively easy and cost-efficient to include in the STL. However, faults of the second type are much harder to detect with an STL because unless they result in a full deadlock these faults may only cause a slight performance degradation which may difficult to time and check, because many other factors come in to play such as cache misses. For the faults of the second type, using the technique shown above with the checksum generator, internal state of the hazarding logic 42 can be exposed to the checksumming testing hardware. Executing small pieces of code, the false hazard could be identified by the checksum derived from the register tracking data failing to match an expected checksum. Hence, this may increase the coverage of the second type of fault and reduce the code size for probing the first type of fault. This can be a significant advantage. For example, for a STL designed to protect against hardware faults in a particular processor design which did not have the checksum generator circuitry 70 described above and which covered only the faults of the first type (which do cause data corruption) and ignored the faults of the second type (which only caused loss of performance), the STL was only able to reach around 50% of coverage for the register hazarding logic 42 despite a significant part of the code base being dedicated to it. By including the checksum generating infrastructure 70 in a processor design, the coverage of the first type of fault may require much less code and also a greater coverage of the second type of fault is possible. This is just one example and similar benefits may be seen from probing other items of internal state discussed above using the checksum generator 70.

Referring to FIG. 2, another way of exposing the checksum generated by the checksum generating circuitry 70 to a diagnostic control agent can be to provide the checksum to a trace buffer 100, which may be used by a trace module 102 which monitors operation of the processor core for diagnostic reasons. The trace module 102 may be provided for assisting with software development so that the trace module 102 monitors the operation of the core and outputs trace packets to a trace buffer 100. The trace packets provide information on events which occurred as a given piece of software was executed. For example the trace data could record information which allows the exact (instruction-by-instruction) sequence of instructions that was executed to be reconstructed, e.g. by tracking the outcomes of conditional branches within the executed instructions, and/or the occurrence of exceptions. Also the trace module may record data addresses that were accessed or other pieces of information. Normally, a trace module would not be concerned with the items of micro-architectural state 74 as discussed above, which relate to the control infrastructure within the processing circuitry, as one would not expect these to reflect bugs in the program. However, by exposing the checksum to the trace buffer, this can allow detection of certain combinations of events of interest which may be useful for triggering the trace module to take some action when a certain patterns of events is detected. Data from the trace buffer 100 may be accessible to an external diagnostic device, for example by reading it out through a externally accessible output port. Similarly, the external diagnostic device may configure configuration registers within the trace module to configure settings such as the definition of the trace trigger events to be detected and the configuration of what types of information are captured in the trace buffer 100. Hence the trace buffer 100 is another example of a diagnostic storage location to which the checksum generator 70 could write the generator checksum to make it accessible to a diagnostic control agent. While FIG. 2 shows an example where the checksum is written both to the checksum register 72 and to the trace buffer 100 it will be appreciated that other examples can only provide one of these two options.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

The invention claimed is:

1. An apparatus comprising:
    processing circuitry to perform data processing in response to instructions;
    at least one control storage element to store invisible-to-software internal state for controlling operation of the processing circuitry, the invisible-to-software internal state not being readable or writeable by software executing on the processing circuitry; and
    checksum generating circuitry to receive at least one item of invisible-to-software internal state stored in said at least one control storage element following processing of a sequence of instructions by the processing circuitry, and to generate a checksum based on said at least one item of invisible-to-software internal state; in which:
    the checksum generating circuitry is configured to store said checksum in a diagnostic storage location from which said checksum generated based on said at least one item of invisible-to-software internal state is accessible to a diagnostic control agent, said diagnostic control agent comprising at least one of the software executing on the processing circuitry and an external diagnostic device configured to probe bugs in the software executing on the processing circuitry or loss of performance.

2. The apparatus according to claim 1, in which the checksum generating circuitry comprises a selector to select said at least one item of invisible-to-software internal state from among a plurality of items of invisible-to-software internal state received from a plurality of control storage elements; and
    the selector is configured to select said at least one item of invisible-to-software internal state based on a selection control signal which is set by the diagnostic control agent or generated based on configuration information set by the diagnostic control agent.

3. The apparatus according to claim 2, in which the selection control signal is derived from a selection control value stored in a software-writable register.

4. The apparatus according to claim 1, in which the checksum generating circuitry is configured to control whether the checksum is updated in response to the at least one item of invisible-to-software internal state, based on a checksum update enable signal set by the diagnostic control agent or generated based on configuration information set by the diagnostic control agent.

5. The apparatus according to claim 4, comprising circuitry to assert the checksum update enable signal in response to a write to a software-writable register.

6. The apparatus according to claim 1, in which the diagnostic storage location comprises a software-accessible register accessible to software executed by the processing circuitry.

7. The apparatus according to claim 1, comprising trace circuitry to monitor data processing by the processing circuitry and to output, to a trace buffer, trace data indicative of properties of, or events occurring during, the data processing performed by the processing circuitry; in which:
the diagnostic storage location comprises the trace buffer.

8. The apparatus according to claim 1, in which the checksum generating circuitry is configured to generate a new value for the checksum using a checksum function which depends on a previous value of the checksum and the at least one item of invisible-to-software internal state.

9. The apparatus according to claim 1, in which the invisible-to-software internal state stored in said at least one control storage element is inaccessible to the diagnostic control agent.

10. The apparatus according to claim 1, in which the at least one control storage element comprises at least one of:
register hazarding circuitry to store register tracking information for detecting register hazards between respective instructions processed by the processing circuitry;
memory hazarding circuitry to store address tracking information for detecting address hazards between respective memory access requests to be serviced by a memory system;
a cache buffer to store information on requests awaiting servicing by a cache, data awaiting allocation into the cache, or data awaiting writeback to memory;
bus control circuitry to store information on bus requests made on a bus; and
a memory controller to store information on memory access requests made to a memory.

11. A method for diagnostic testing of an apparatus comprising processing circuitry to perform data processing in response to instructions, and at least one control storage element to store invisible-to-software internal state for controlling operation of the processing circuitry, the invisible-to-software internal state not being readable or writeable by software executing on the processing circuitry, the method comprising:
controlling checksum generating circuitry of the apparatus to generate a checksum based on at least one item of invisible-to-software internal state stored in said at least one control storage element following processing of a sequence of instructions by the processing circuitry;
a diagnostic control agent reading the checksum generated by the checksum generating circuitry based on said at least one item of invisible-to-software internal state from a diagnostic storage location accessible to the diagnostic control agent, where the diagnostic control agent comprises at least one of software executing on the processing circuitry and an external diagnostic device configured to probe bugs in the software executing on the processing circuitry or loss of performance; and
comparing the checksum read from the diagnostic storage location with a target value to determine whether an event of interest occurred during the processing of the sequence of instructions by the processing circuitry.

12. The method of claim 11, further comprising selecting, based on selection control information set by the diagnostic control agent, said at least one item of invisible-to-software internal state from among a plurality of items of invisible-to-software internal state stored in a plurality of control storage elements of the apparatus.

13. A non-transitory storage medium storing a computer program for controlling an apparatus to perform the method of claim 11.

14. The non-transitory storage medium of claim 13, in which the computer program comprises a software test library (STL) program.

* * * * *